United States Patent
Tsai et al.

(10) Patent No.: US 10,170,658 B2
(45) Date of Patent: Jan. 1, 2019

(54) SEMICONDUCTOR PACKAGE STRUCTURES AND METHOD OF MANUFACTURING THE SAME

(71) Applicant: Advanced Semiconductor Engineering, Inc., Kaohsiung (TW)

(72) Inventors: Yu-Hsuan Tsai, Kaohsiung (TW); Lu-Ming Lai, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 52 days.

(21) Appl. No.: 14/941,069

(22) Filed: Nov. 13, 2015

(65) Prior Publication Data
US 2017/0141257 A1    May 18, 2017

(51) Int. Cl.
*H01L 31/173* (2006.01)
*H01L 25/16* (2006.01)

(52) U.S. Cl.
CPC .......... *H01L 31/173* (2013.01); *H01L 25/167* (2013.01)

(58) Field of Classification Search
CPC ...................................... H01L 24/11
USPC ............................................. 257/83
See application file for complete search history.

(56) References Cited

U.S. PATENT DOCUMENTS

| | | | | |
|---|---|---|---|---|
| 4,857,746 A * | 8/1989 | Kuhlmann | ............ | G01V 8/12 250/551 |
| 5,654,559 A * | 8/1997 | Spaeth | ............ | H01L 23/48 250/551 |
| 7,030,359 B2 * | 4/2006 | Romhild | ............ | G01S 7/4811 250/214 R |
| 7,309,855 B2 * | 12/2007 | Nagasaka | ............ | G01D 5/305 250/231.14 |
| 2003/0109142 A1 * | 6/2003 | Cable | ............ | G02B 6/4231 438/708 |
| 2003/0201462 A1 * | 10/2003 | Pommer | ............ | G02B 6/4201 257/200 |
| 2005/0218300 A1 * | 10/2005 | Quinones | ............ | G02B 6/4201 250/214 R |
| 2011/0002587 A1 * | 1/2011 | Bogner | ............ | H01L 25/167 385/93 |
| 2011/0235974 A1 * | 9/2011 | Tay | ............ | G02B 6/43 385/39 |
| 2012/0076455 A1 * | 3/2012 | Siew | ............ | H01L 31/0203 385/14 |
| 2014/0097536 A1 | 4/2014 | Schunk | | |
| 2014/0212085 A1 * | 7/2014 | Margaritis | ............ | H01L 24/11 385/14 |
| 2015/0028357 A1 * | 1/2015 | Tu | ............ | H01L 25/167 257/82 |

(Continued)

*Primary Examiner* — Igwe U Anya
(74) *Attorney, Agent, or Firm* — Foley & Lardner LLP; Cliff Z. Liu

(57) ABSTRACT

An optical device includes a substrate, a light emitter, a light detector, a conductive structure, and an opaque material. The light emitter, the light detector and the conductive structure are disposed on a surface of the substrate and are electrically connected to traces on the surface of the substrate. The light emitter includes an emitting area facing the substrate. The light detector includes a receiving area facing the substrate. The light emitter emits light within a range of wavelengths, and the substrate passes the light emitted by the light emitter. The opaque material is disposed on the substrate, and absorbs or attenuates the light within the range of wavelengths.

21 Claims, 15 Drawing Sheets

(56) References Cited

U.S. PATENT DOCUMENTS

2015/0028358 A1* 1/2015 Tu ........................ H01L 31/173
 257/82
2015/0028359 A1* 1/2015 Tu .......................... H01L 33/54
 257/82

* cited by examiner

SEMICONDUCTOR PACKAGE STRUCTURES AND METHOD OF MANUFACTURING THE SAME

BACKGROUND

1. Technical Field

The present disclosure relates to semiconductor package structures and methods of manufacturing the same, and more particularly to semiconductor package structures having a glass substrate and manufacturing methods thereof.

2. Description of the Related Art

Optical sensor devices are widely used in health monitors to determine physiological characteristics of a person because of a non-invasive nature. For example, a health monitor having an optical sensor device (e.g., an oxihemometer) is a non-invasive apparatus for monitoring a person's blood oxygen saturation. An optical sensor device may be placed on a thin part of the person's body, usually a fingertip or earlobe, or in the case of an infant, across a foot. For example, the optical sensor device passes two or more wavelengths of light through the body part to a photodetector. A changing absorbance at each of the wavelengths is measured, allowing the health monitor to determine absorbance of pulsing blood.

SUMMARY

In an aspect, an optical device includes a substrate, a light emitter, a light detector, a conductive structure, and an opaque material. The light emitter, the light detector and the conductive structure are disposed on a surface of the substrate and are electrically connected to traces on the surface of the substrate. The light emitter includes an emitting area facing the substrate. The light detector includes a receiving area facing the substrate. The light emitter emits light within a range of wavelengths, and the substrate passes the light emitted by the light emitter. The opaque material is disposed on the substrate, and absorbs or attenuates the light within the range of wavelengths.

In an aspect, an optical device includes a substrate; a light emitter, a light receiver, a conductive structure, and an opaque material. The light emitter includes an emitting area facing a surface of the substrate, and the light emitter emits light within a range of wavelengths. The light receiver includes a receiving area facing the surface of the substrate, and the light receiver receives the light reflected from an object and passed through the substrate. The conductive structure is disposed on and electrically connected to the substrate. The opaque material is disposed on the substrate between the light emitter and the light receiver.

In an aspect, a method of making an optical device includes providing a substrate, disposing a light emitter on a surface of the substrate, disposing a light receiver on the surface of the substrate, and disposing an opaque material on the substrate between the light emitter and the light receiver. The substrate includes a conductive structure disposed on and electrically connected to the substrate. The light emitter includes an emitting area, and the light emitter is disposed such that the emitting area faces the surface of the substrate. The light receiver includes a receiving area, and the light receiver is disposed such that the receiving area faces the surface of the substrate.

Figure 1:
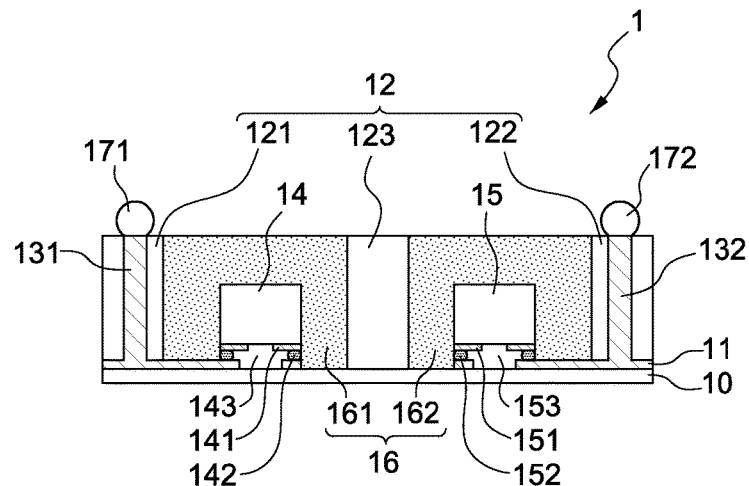
FIG. 1 illustrates a semiconductor package structure in accordance with an embodiment of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

FIG. 1 illustrates a semiconductor package structure in accordance with an embodiment of the present disclosure.

Referring to FIG. 1, a semiconductor package structure 1 includes a substrate 10, traces 11, a dielectric layer 12, conductive structures 131 and 132, a light emitter 14, a light detector 15 (e.g., a photodetector), an encapsulant 16 and solder balls 171 and 172.

In one or more embodiments, the dielectric layer 12 and the conductive structures 131 and 132 are included in a preformed substrate. In one or more further embodiments, such a preformed substrate includes embedded traces and vias, such as embedded in the dielectric layer 12 and/or the encapsulant 16 (e.g., traces 11, and/or traces and vias not shown). In one or more embodiments, the dielectric layer 12 is a plurality of prepreg layers. In other embodiments, the dielectric layer 12 is another suitable material.

The substrate 10 includes a material transparent to light within a selected range of wavelengths. The material of the substrate 10 may be transparent to visible light, for example, having a transmittance of visible light of at least about 70%, at least about 80%, or at least about 90% or greater. One example of such a transparent material is glass. In one or more embodiments, the material of the substrate 10 blocks light and other radiation within one or more selected wavelength ranges.

The traces 11 are disposed on the substrate 10. The traces 11 include a conductive material such as, for example, copper (Cu), gold (Au), silver (Ag), aluminum (Al), titanium (Ti), an alloy thereof, or another suitable metal or alloy. In one or more embodiments, the traces 11 include Indium Tin Oxide (ITO). The traces 11 may include pads or other conductive connections. The traces 11 formed on the substrate 10 may be incorporated in a redistribution layer (RDL).

The dielectric layer 12 is disposed on the substrate 10. The dielectric layer 12 includes a portion 121, a portion 122 and a portion 123. In one or more embodiments, the dielectric layer 12 is an electrical insulator. In one or more embodiments, the dielectric layer 12 exhibits a high value of mechanical strength, such as a high strength to weight ratio. In one or more embodiments, the dielectric layer 12 exhibits very low (near zero) water absorption. In one or more embodiments, the dielectric layer 12 includes a material exhibiting high temperature cycling endurance. In one or more embodiments, the dielectric layer 12 is an electrical insulator with high mechanical strength, very low water absorption, and high temperature cycling endurance. Examples of materials that may be used in dielectric layer 12 include benzocyclobutene (BCB), polyimide, dry film, and glass-reinforced epoxy (e.g., FR-4).

The light emitter 14 is disposed on the substrate 10. The light emitter 14 includes a light emitting area facing the substrate 10. The light emitter 14 includes bonding pads 141. The light emitter 14 is disposed in a space defined between the portion 121 of the dielectric layer 12 and the portion 123 of the dielectric layer 12. The light emitter 14 is attached to, and electrically connected to, respective ones of the traces 11 through the bonding pads 141 and solder bumps 142. The bonding pads 141 include a conductive material, such as, for example, Cu, Au, Ag, Al, an alloy thereof, or another suitable metal or alloy. In one or more embodiments, the light emitter 14 is a light emitting diode (LED) or multiple LEDs. In other embodiments, the light emitter 14 is another illuminating device. In FIG. 1, the light emitter 14 is illustrated as a flip-chip type die, but may be of another type in another embodiment. The light emitter 14 may be a single die or multiple dies. In one or more embodiments, the light emitter 14 includes two or more dies that each emit different wavelengths of light, such as in the visible range, the infrared range, or other range.

The light detector 15 is disposed on the substrate 10. The light detector 15 includes a light receiving area facing the substrate 10. The light detector 15 is disposed in a space defined between the portion 122 of the dielectric layer 12 and the portion 123 of the dielectric layer 12. The light detector 15 includes bonding pads 151. The light detector 15 is attached to, and electrically connected to, ones of the traces 11 through the bonding pads 151 and solder bumps 152. In FIG. 1, the light detector 15 is illustrated as a flip-chip type die, but may be of another type in another embodiment.

The light emitter 14 and the light detector 15 are separated by the portion 123 of the dielectric layer 12. The portion 123 of the dielectric layer 12 blocks light emitted from the light emitter 14 from directly reaching the light detector 15. Note that the portions 121, 122 and 123 are identified in a cross-sectional view; in a top view (not shown), the portion 121 with the portion 123 may fully surround the light emitter 14, and the portion 122 with the portion 123 may fully surround the light detector 15. For example, the portion 123 may provide a divider between the light emitter 14 and the light detector 15. In such embodiments, the portion 121 may be coupled to, or integrally formed with, the portion 123 at two ends of the portion 121 to form a wall around the light emitter 14. Similarly the portion 122 may be coupled to, or integrally formed with, the portion 123 at two ends of the portion 122 to form a wall around the light detector 15.

Encapsulant 16 includes encapsulant portion 161 and encapsulant portion 162. In one or more embodiments, the encapsulant portion 161 and the encapsulant portion 162 include the same material(s); however, in other embodiments, the encapsulant portion 161 and the encapsulant portion 162 include different materials. Encapsulant 16 (e.g., one or both of the encapsulant portion 161 and the encapsulant portion 162) may include, for example, an epoxy resin, or an epoxy resin including hardeners (e.g., fillers). In one or more embodiments, the encapsulant 16 may additionally or alternatively include an adhesive, or an adhesive including fillers. When fillers are included in the encapsulant 16, a size of the fillers may be preselected.

Encapsulant portion 161 is disposed in the space defined between the portion 121 of the dielectric layer 12 and the portion 123 of the dielectric layer 12. Encapsulant portion 161 encapsulates the light emitter 14 and a portion of the traces 11. However, a space 143 between the light emitter 14 and the substrate 10 is not filled with the encapsulant 16 (i.e., not filled with the encapsulant portion 161), so that light from the light emitter 14 is not inhibited before reaching the substrate 10. In one or more embodiments, the encapsulant portion 161 includes carbon black or a pigment or other opaque material, to absorb or attenuate light emitted from the light emitter 14, such as having a transmittance of visible light (or other range of wavelengths emitted by the light emitter 14) of no greater than about 40%, no greater than about 30%, or no greater than about 20%.

Encapsulant portion 162 is disposed in the space defined between the portion 122 of the dielectric layer 12 and the portion 123 of the dielectric layer 12. Encapsulant portion 162 encapsulates the light detector 15 and a portion of the traces 11. However, a space 153 between the light detector 15 and the substrate 10 is not filled with the encapsulant 16 (i.e., not filled with the encapsulant portion 162), so that light which passes the substrate 10 may reach the light detector 15 without being inhibited. In one or more embodiments, the encapsulant portion 162 includes carbon black or a pigment or other opaque material, to absorb or attenuate light emitted from the light emitter 14, such as having a transmittance of visible light (or other range of wavelengths emitted by the light emitter 14) of no greater than about 40%, no greater than about 30%, or no greater than about 20%.

In one or more embodiments in which one or both of the encapsulant portion 161 or the encapsulant portion 162 includes carbon black or a pigment (or otherwise is, or includes, a material that absorbs or attenuates light), the portion 123 of the dielectric layer 12 is omitted.

The conductive structure 131 is disposed on and electrically connected to a respective trace 11. The conductive structure 131 is laterally surrounded by the portion 121 of the dielectric layer 12. The conductive structure 131 is disposed between the respective trace 11 and the solder ball 171, such that the solder ball 171 is electrically connected to the respective trace 11 through the conductive structure 131. The conductive structure 131 may be a conductive pillar or post, and may include, for example, Cu or another suitable metal, or an alloy.

The conductive structure 132 is disposed on and electrically connected to a respective trace 11. The conductive structure 132 is laterally surrounded by the portion 122 of the dielectric layer 12. The conductive structure 132 is disposed between the respective trace 11 and the solder ball 172, such that the solder ball 172 is electrically connected to the respective trace 11 through the conductive structure 132. The conductive structure 132 may be a conductive pillar or post, and may include, for example, Cu or another suitable metal, or an alloy.

One or both of the conductive structures 131 and 132 may include concentric structures, such as an inner through via surrounded by an outer conductive or non-conductive shell.

Having described the semiconductor package structure 1, an example of its use is provided for better understanding. In an example of a oxihemometer, light emitted from the light emitter 14 passes through the substrate 10 to an object (e.g., wrist, fingertip or other body part), the light is reflected from the object, passes through the substrate 10, and is received by the light detector 15. The oxihemometer is but one example, and other uses of the semiconductor package structure 1 (and other embodiments of the present disclosure) abound.

Figure 2:
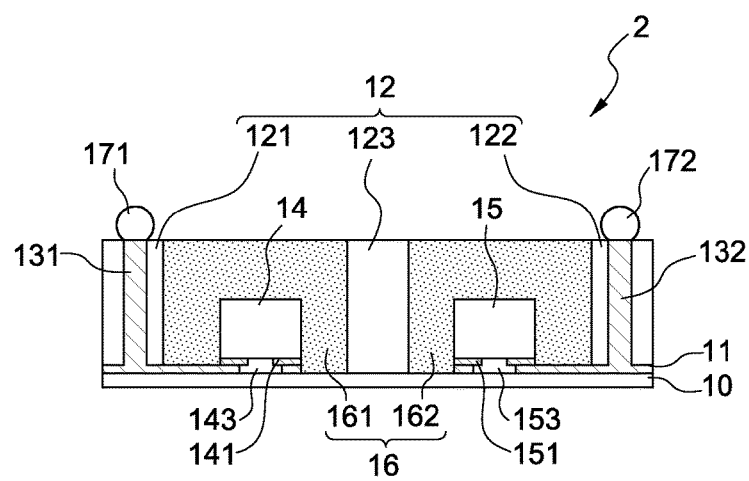
FIG. 2 illustrates a semiconductor package structure in accordance with another embodiment of the present disclosure.

FIG. 2 illustrates a semiconductor package structure 2 in accordance with another embodiment of the present disclosure.

Referring to FIG. 2, the semiconductor package structure 2 is similar to the semiconductor package structure 1 as illustrated and described with reference to FIG. 1, except that the solder bumps 142 and 152 are omitted, and bonding pads 141 and 151 are directly bonded to the traces 11.

Figure 3:
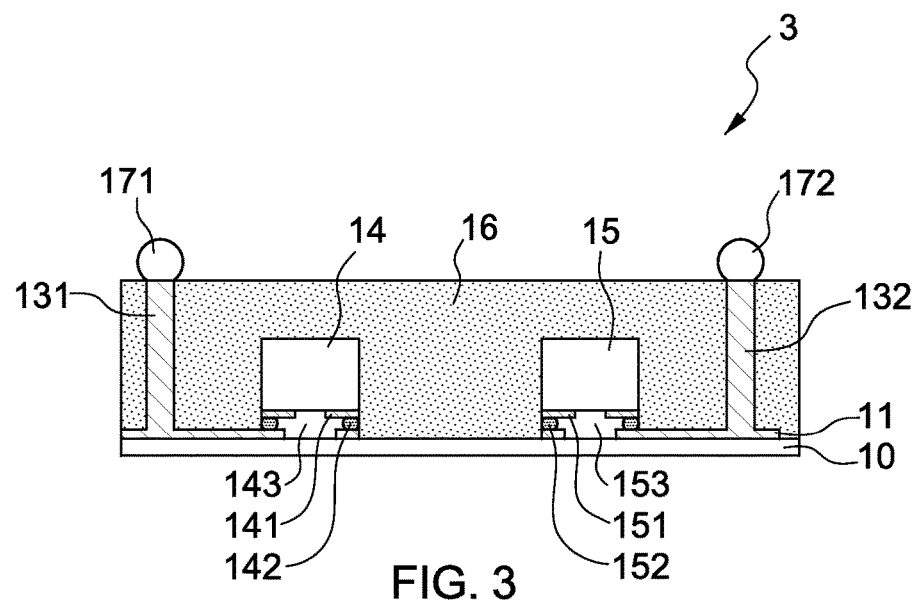
FIG. 3 illustrates a semiconductor package structure in accordance with another embodiment of the present disclosure.

FIG. 3 illustrates a semiconductor package structure 3 in accordance with another embodiment of the present disclosure.

Referring to FIG. 3, the semiconductor package structure 3 is similar to the semiconductor package structure 1 as illustrated and described with reference to FIG. 1, except that the dielectric layer 12 is omitted. The encapsulant 16 encapsulates the substrate 10, the traces 11, the light emitter 14, the light detector 15 and the conductive structures 131 and 132.

Figure 4:
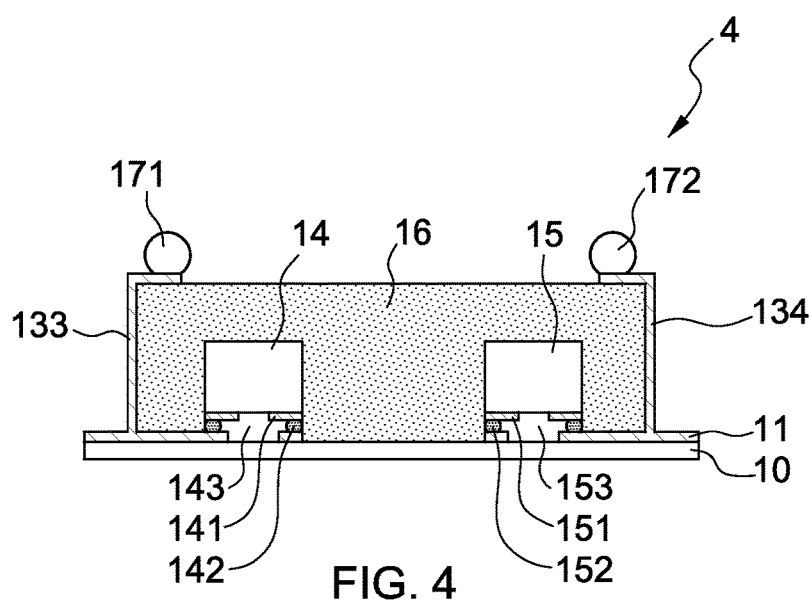
FIG. 4 illustrates a semiconductor package structure in accordance with another embodiment of the present disclosure.

FIG. 4 illustrates a semiconductor package structure 4 in accordance with another embodiment of the present disclosure.

Referring to FIG. 4, the semiconductor package structure 4 is similar to the semiconductor package structure 3 as illustrated and described with reference to FIG. 3, except that the conductive structures 131 and 132 are respectively replaced by conductive traces 133 and 134, which are disposed on sidewall surfaces of the encapsulant 16. The conductive traces 133 and 134 electrically connect respective solder balls 171 and 172 to ones of the traces 11.

Figure 5:
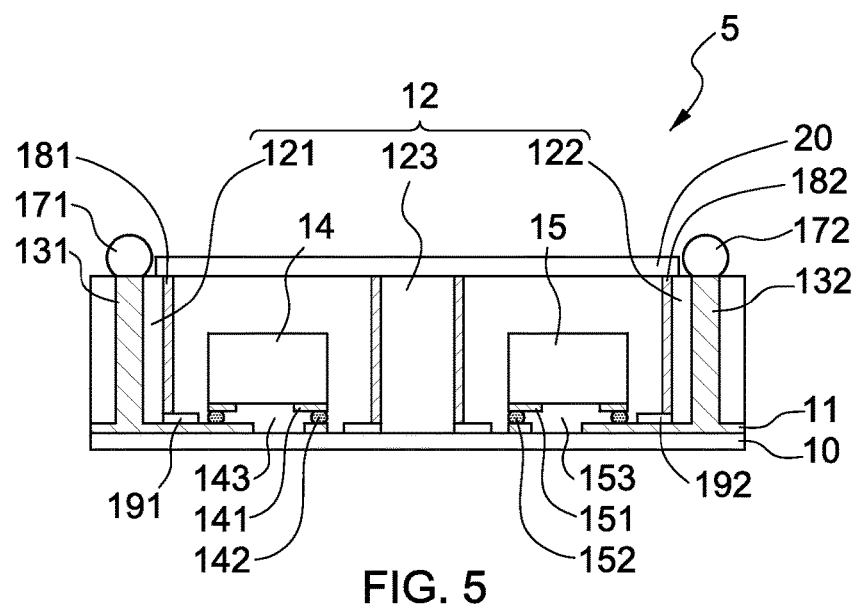
FIG. 5 illustrates a semiconductor package structure in accordance with another embodiment of the present disclosure.

FIG. 5 illustrates a semiconductor package structure 5 in accordance with another embodiment of the present disclosure.

Referring to FIG. 5, the semiconductor package structure 5 includes a substrate 10, traces 11, a dielectric layer 12, conductive structures 131 and 132, a light emitter 14, a light detector 15, solder balls 171 and 172, light blocking layers 181 and 182, isolators 191 and 192, and a lid 20.

The substrate 10, traces 11, dielectric layer 12, conductive structures 131 and 132, light emitter 14, light detector 15 and solder balls 171 and 172 of the semiconductor package structure 5 are similar to the respective substrate 10, traces 11, dielectric layer 12, conductive structures 131 and 132, light emitter 14, light detector 15 and solder balls 171 and 172 of the semiconductor package structure 1 as illustrated and described with reference to FIG. 1 and are not further described with respect to FIG. 5.

The light blocking layer 181 is disposed within the space defined between the portion 121 and the portion 123 of the dielectric layer 12, on inner sidewalls of the portion 121 and the portion 123 of the dielectric layer 12. The light blocking layer 182 is disposed within the space defined between the portion 122 and the portion 123 of the dielectric layer 12, on inner sidewalls of the portion 122 and the portion 123 of the dielectric layer 12. In one or more embodiments, a material of the light blocking layer 181 is different from a material of the light blocking layer 182; in other embodiments, the light blocking layers 181 and 182 include the same materials. For example, one or both of the light blocking layers 181 and 182 may include Cu, Al, another metal, an alloy, a non-metal, or a combination thereof. In one or more embodiments, one or both of the light blocking layers 181 and 182 exhibit good light absorption characteristics. In one or more embodiments, one or both of the light blocking layers 181 and 182 have an intentionally uneven or relatively rough surface to absorb light. In one or more embodiments, one or both of the light blocking layer s 181 and 182 is treated with a black oxide to absorb or attenuate light.

The isolator 191 is disposed on the traces 11 to isolate or separate the light blocking layer 181 from the traces 11. In one or more embodiments, the isolator 191 is disposed across portions of the substrate 10 to provide isolation between the light blocking layer 181 and multiple traces 11 to which the light blocking layer 181 would otherwise come in contact. In one or more embodiments, each of multiple isolators 191 is disposed on a respective trace 11. The isolator 192 is disposed on the traces 11 to isolate or separate the light blocking layer 182 from the traces 11. In one or more embodiments, the isolator 192 is disposed across portions of the substrate 10 to provide isolation between the light blocking layer 182 and multiple traces 11 to which the light blocking layer 182 would otherwise come in contact. In one or more embodiments, each of multiple isolators 192 is disposed on a respective trace 11. The isolators 191 and 192 may each be an insulating layer or a passivation layer. The isolators 191 and 192 may include, for example, polyimide, BCB, dry film, or another suitable material.

The lid 20 is disposed on the dielectric layer 12 and covers the light blocking layers 181 and 182 and portions of the dielectric layer 12. The lid 20 protects the light emitter 14 and the light detector 15 from damage such as might be caused by particulates or liquids. The lid 20 may include, for example, an aromatic polymer (e.g., a liquid-crystal polymer (LCPs)), or another opaque material. In one or more embodiments, the lid 20 includes carbon black or a pigment to absorb light from the light emitter 14. The lid 20 may be coated with a metal layer (not shown) facing towards the light emitter 14 to reflect light from the light emitter 14.

FIGS. 6A-6F illustrate a manufacturing method in accordance with an embodiment of the present disclosure.

Figure 6A:
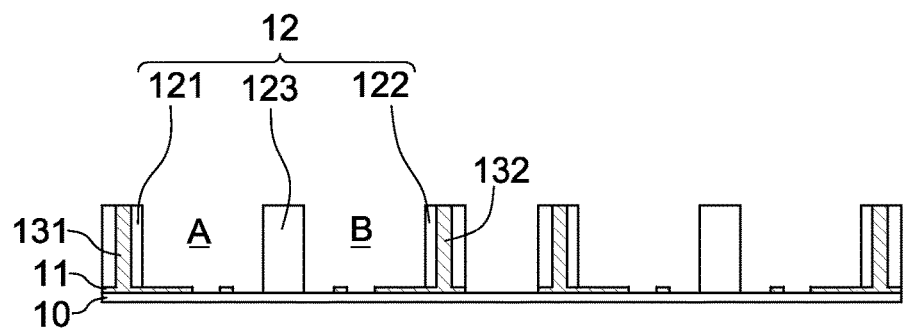
FIG. 6A, FIG. 6B, FIG. 6C, FIG. 6D, FIG. 6E and FIG. 6F illustrate a manufacturing method in accordance with an embodiment of the present disclosure.

Referring to FIG. 6A, a transparent substrate 10 is provided. The substrate 10 includes a layer of traces 11, a dielectric layer 12 and conductive structures 131 and 132 on a top surface of the substrate 10. The dielectric layer 12 may be formed, for example, by wafer-level semiconductor manufacturing techniques. The dielectric layer 12 includes a portion 121, a portion 122 and a portion 123. The portion 121 of the dielectric layer 12 and the portion 123 of the dielectric layer 12 define a space A. The portion 122 of the dielectric layer 12 and the portion 123 of the dielectric layer 12 define another space B. It should be understood that the spaces A and B are three-dimensional spaces, shown in cross-section.

Note that in FIGS. 6A-6F, one grouping of components is identified by number. Another substantially identical grouping of components is also shown, indicating that multiple semiconductor package structures may be manufactured together on one substrate 10, and then separated into single units (e.g., FIG. 6F).

The layer of traces 11 may be formed, for example, by a jetting or plating technique.

In one or more embodiments, the dielectric layer 12 includes conductive structures 131 and 132, and the dielectric layer 12 (with the conductive structures 131 and 132) is attached to the substrate 10 such that the conductive structures 131 and 132 are disposed on and electrically connected to respective ones of the traces 11. The conductive structure 131 is laterally surrounded by the portion 121 of the dielectric layer 12.

The conductive structure 132 is laterally surrounded by the portion 122 of the dielectric layer 12.

The dielectric layer 12 may include a multi-layer structure made of prepreg layers. The traces 11 formed on the substrate 10 may be included in a redistribution layer (RDL).

Figure 6B:
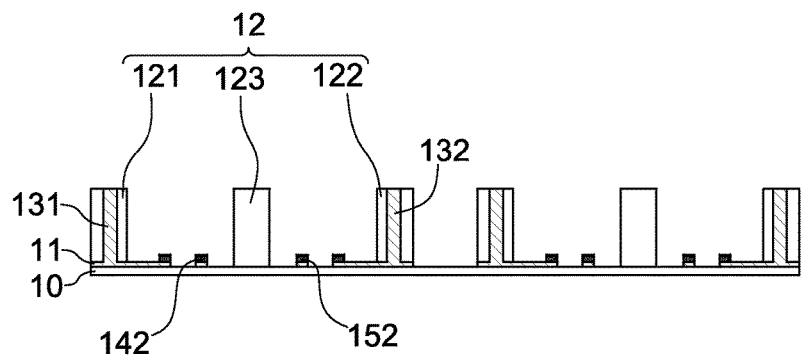
Figure 6C:
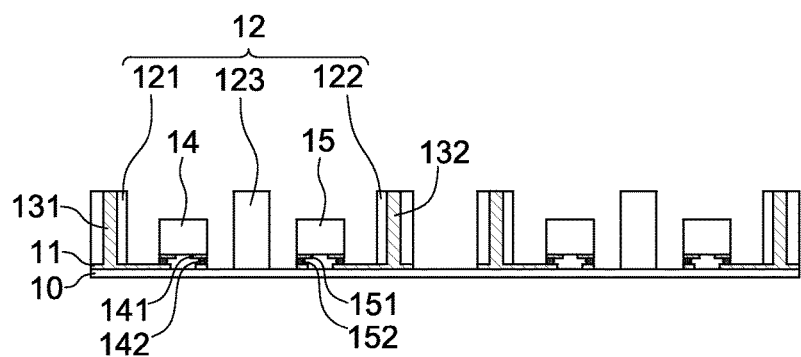

Referring to FIG. 6B, solder bumps 142 and 152 are formed on respective ones of the traces 11 by, for example, a jetting or plating technique. In one or more embodiments, the solder bumps 142 or the solder bumps 152 are replaced with copper pillars. Referring to FIG. 6C, a light emitter 14 is disposed on the solder bumps 142 in the space A and a light detector 15 is disposed on the solder bumps 152 in the space B. The light emitter 14 includes a light emitting area facing the substrate 10. The light detector 15 includes a light receiving area facing the substrate 10. The light emitter 14 includes bonding pads 141, and the light detector 15 includes bonding pads 151. A reflow operation is then performed to bond the light emitter 14 and the light detector 15 to the respective traces 11. In one or more embodiments, the solder bumps 142 and 152 have a maximum width or diameter of about 20-50 micrometers ($\mu$m). In one or more embodiments, the solder bumps 142 or the solder bumps 152 are omitted; in such embodiments, the bonding pads 141 and the bonding pads 151 are bonded directly to respective traces 11 (see, e.g., FIG. 7A).

Figure 6D:
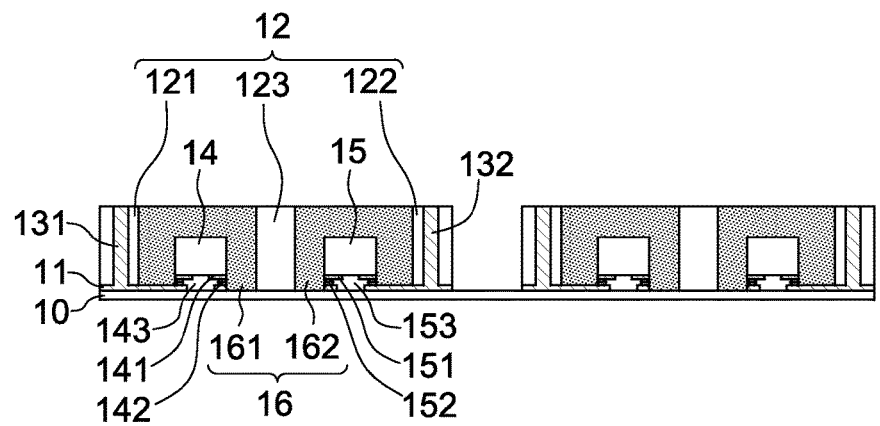

Referring to FIG. 6D, an encapsulating material is filled into one or both of the space A and the space B to form encapsulant 16 (e.g., an encapsulant portion 161 in the space A and an encapsulant portion 162 in the space B), such as by a dispensing technique. In one or more embodiments, the encapsulating material is, or includes, a black adhesive with high viscosity and high temperature cycling endurance; in other embodiments, the encapsulating material may be, or may include, a different material. For example, the encapsulating material may be an epoxy resin with hardeners (e.g., fillers). When an opaque material is used, the opaque material may absorb or attenuate light from the light emitter 14. In one or more embodiments in which both of the spaces A and B are filled, the spaces may be filled with a same material or materials, or with different material(s).

Encapsulant portion 161 encapsulates the light emitter 14 and a portion of the traces 11. Solder bumps 142 block the encapsulating material from flowing under the light emitter 14, such that the light emitter 14, the traces 11 and the encapsulant portion 161 define a space 143 between the substrate 10 and the light emitter 14.

Encapsulant portion 162 encapsulates the light detector 15 and a portion of the traces 11. Solder bumps 152 block the encapsulating material from flowing under the light detector 15, such that the light detector 15, the traces 11 and the encapsulant portion 162 define a space 153 between the substrate 10 and the light detector 15.

Figure 6E:
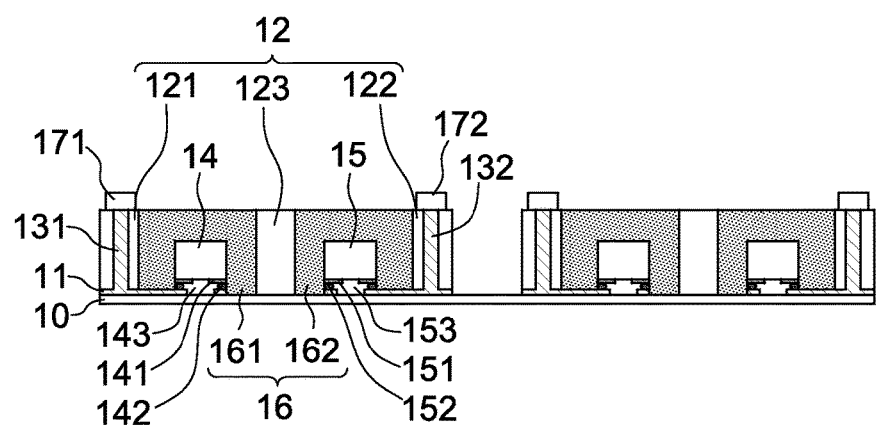

Referring to FIG. 6E, solder paste (which will form solder balls 171 and 172) is disposed on the portion 121 of the dielectric layer 12 and the portion 122 of the dielectric layer 12 by, for example, a printing, plating, or ball dropping technique. The solder paste on the portion 121 and the portion 122 is electrically connected to the conductive structures 131 and 132, respectively.

Figure 6F:
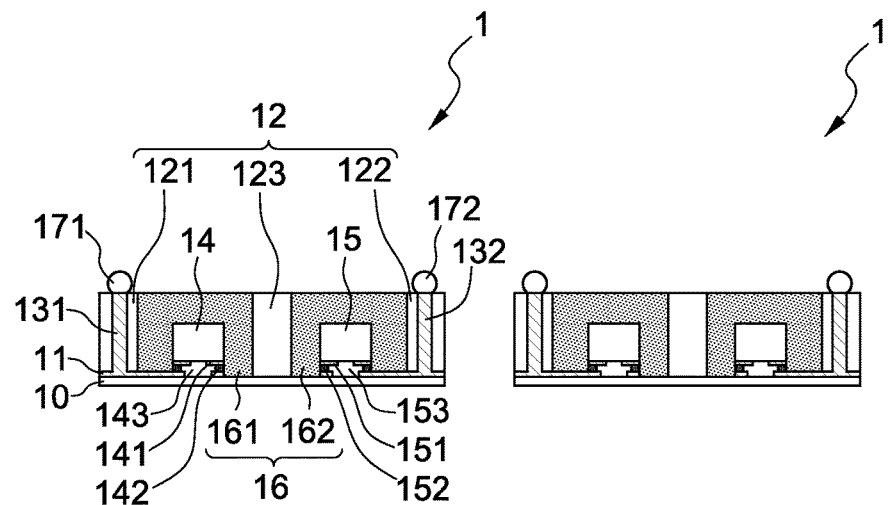

Referring to FIG. 6F, a reflow operation is performed to form solder balls 171 and 172 from the solder paste. A singulation or cutting operation is then performed to form multiple ones of the semiconductor package structure 1 as shown in FIG. 1.

Figure 7A:
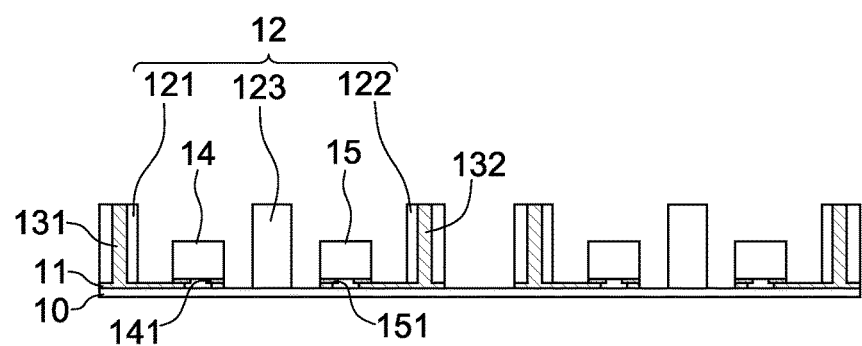
FIG. 7A, FIG. 7B, FIG. 7C and FIG. 7D illustrate a manufacturing method in accordance with another embodiment of the present disclosure.

FIGS. 7A-7D illustrate a manufacturing method in accordance with another embodiment of the present disclosure. FIG. 7A follows the stage of manufacture illustrated in FIG. 6A. FIGS. 7A-7D are similar to FIGS. 6C-6F, except that the solder bumps 142 and 152 are omitted.

Referring to FIG. 7A, a light emitter 14 is disposed on the traces 11 in space A and a light detector 15 is disposed on the traces 11 in space B. The light emitter 14 includes a light emitting area facing the substrate 10. The light detector 15 includes a light receiving area facing the substrate 10. A metal-metal bonding technique is then performed to directly bond the bonding pads 141 and 151 to the traces 11.

Figure 7B:
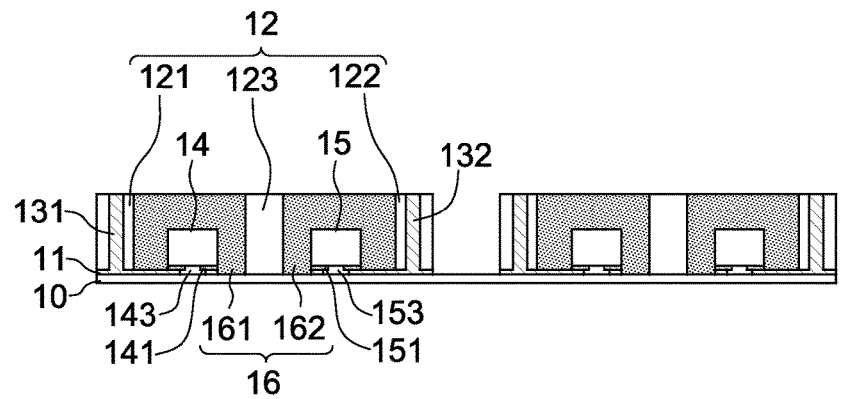

Referring to FIG. 7B, an encapsulating material is filled into one or both of spaces A and B, forming an encapsulant 16 including an encapsulant portion 161 in the space A and an encapsulant portion 162 in the space B. The encapsulating material, the encapsulant portion 161, and the encapsulant portion 162 are as described with respect to FIG. 6D. Because the solder bumps 142 are omitted (as compared to FIGS. 6A-6F), the light emitter 14, the traces 11 and the encapsulant portion 161 define a space 143 between the substrate 10 and the light emitter 14. Because the solder bumps 152 are omitted (as compared to FIGS. 6A-6F), the light detector 15, the traces 11 and the encapsulant portion 162 define a space 153 between the substrate 10 and the light detector 15.

Figure 7C:
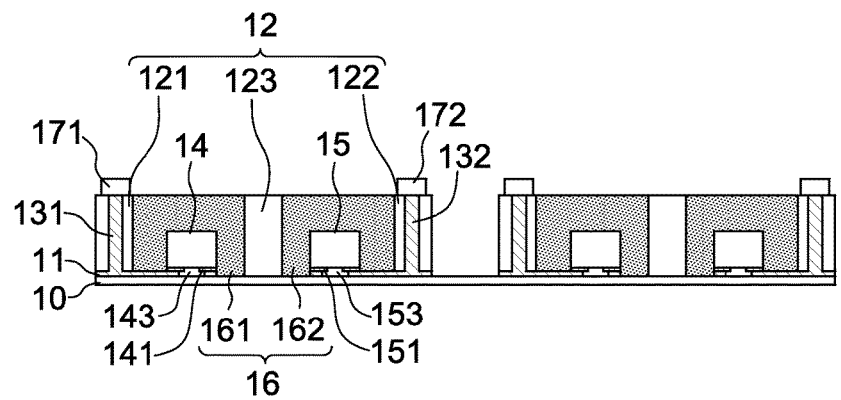

Referring to FIG. 7C, solder paste (which will form solder balls 171 and 172) is disposed on the portion 121 of the dielectric layer 12 and the portion 122 of the dielectric layer 12 by, for example, a printing, plating, or ball dropping technique. The solder paste on the portion 121 and the portion 122 is electrically connected to the conductive structures 131 and 132, respectively.

Figure 7D:
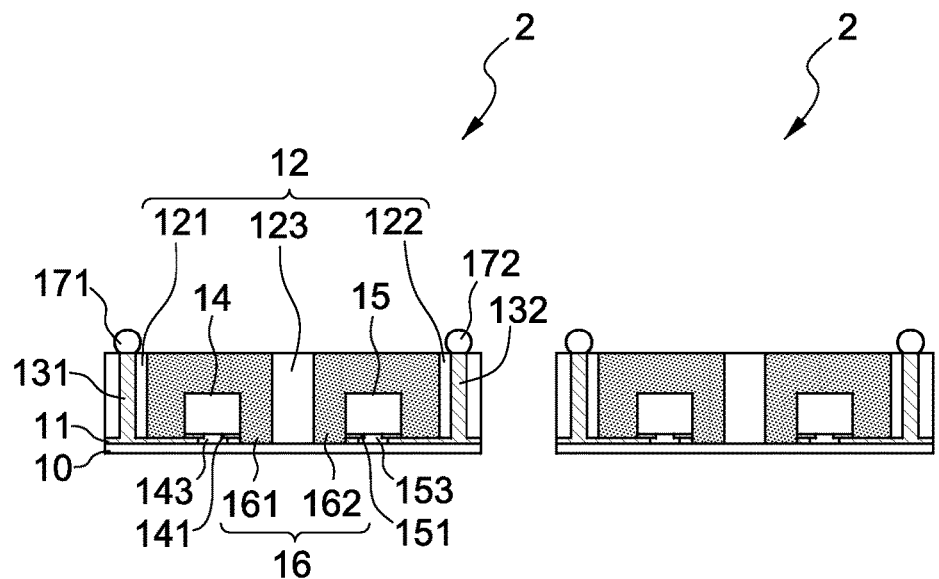

Referring to FIG. 7D, a reflow operation is performed to form solder balls 171 and 172 from the solder paste. A singulation or cutting operation is then performed to form multiple ones of the semiconductor package structure 2 as shown in FIG. 2.

FIGS. 8A-8D illustrate a manufacturing method in accordance with another embodiment of the present disclosure.

Figure 8A:
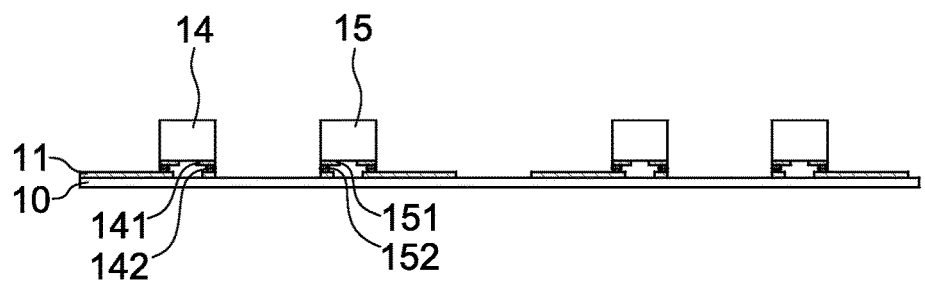
FIG. 8A, FIG. 8B, FIG. 8C and FIG. 8D illustrate a manufacturing method in accordance with another embodiment of the present disclosure.

Referring to FIG. 8A, a transparent substrate 10 is provided. The substrate 10 includes a layer of traces 11 on a top surface of the substrate 10. A light emitter 14 is attached to the traces 11 by solder bumps 142, and a light detector 15 is attached to the traces 11 by solder bumps 152. The light emitter 14 includes a light emitting area facing the substrate 10. The light detector 15 includes a light receiving area facing the substrate 10. Note that in FIGS. 8A-8D, one grouping of components is identified by number. Another substantially identical grouping of components is also shown, indicating that multiple semiconductor package structures may be manufactured together on one substrate 10, and then separated into single units (e.g., FIG. 8D).

Figure 8B:
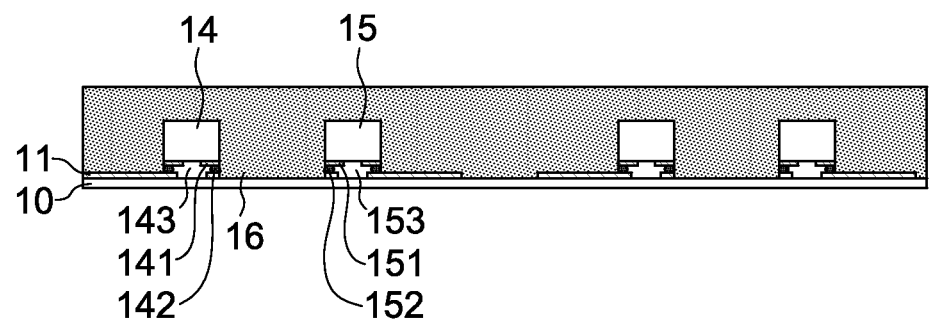

Referring to FIG. 8B, an encapsulant 16 is formed to encapsulate the substrate 10, the traces 11, the light emitter 14 and the light detector 15. The encapsulant 16 may be formed by, for example, an over-mold technique or other technique. Encapsulant 16 may include, for example, an epoxy resin with hardeners (e.g., fillers). The light emitter 14, the traces 11 and the encapsulant 16 define a space 143 between the substrate 10 and the light emitter 14, and the light detector 15, the traces 11 and the encapsulant 16 define a space 153 between the substrate 10 and the light detector 15.

Figure 8C:
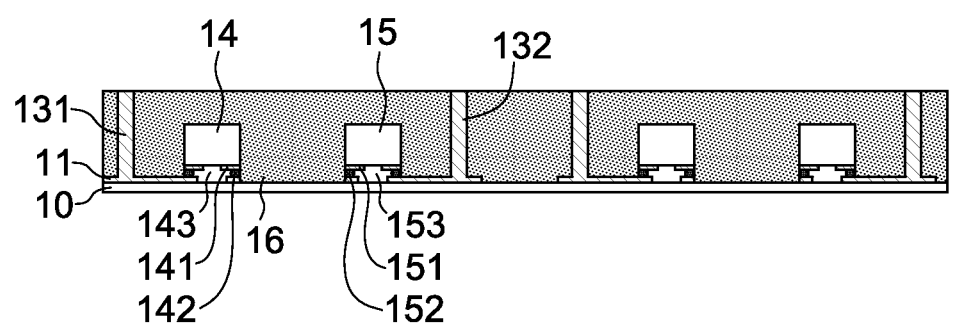

Referring to FIG. 8C, a number of openings (not shown in FIG. 8C) are formed in the encapsulant 16 to accommodate a formation of pillars or posts. The openings are formed, for example, by a photolithographic technique or a drilling technique (e.g., mechanical drilling or laser drilling). The openings expose portions of the traces 11. The openings are filled with a conductive material, such as, for example, Cu, another metal, an alloy, or another suitable conductive material. The openings may be filled by a plating technique or other technique to form conductive structures 131 and 132 on the traces 11. The conductive structures 131 and 132 are electrically connected to the traces 11.

Figure 8D:
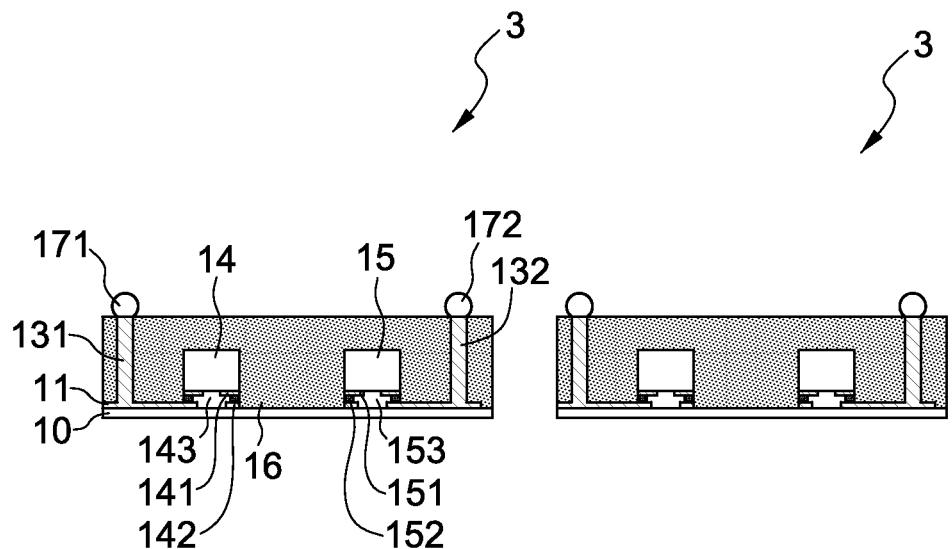

Referring to FIG. 8D, solder balls 171 and 172 are formed on the encapsulant 16 and are electrically connected to the conductive structures 131 and 132. A singulation or cutting operation is then performed to form multiple ones of the semiconductor package structure 3 as shown in FIG. 3.

Figure 9A:
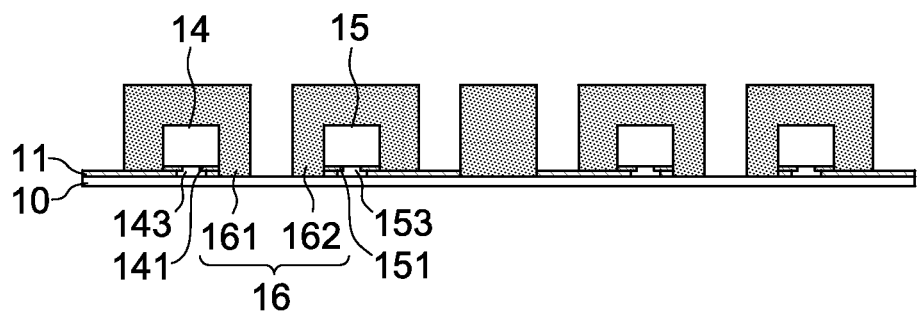
FIG. 9A and FIG. 9B illustrate a manufacturing method in accordance with another embodiment of the present disclosure.
Figure 9B:
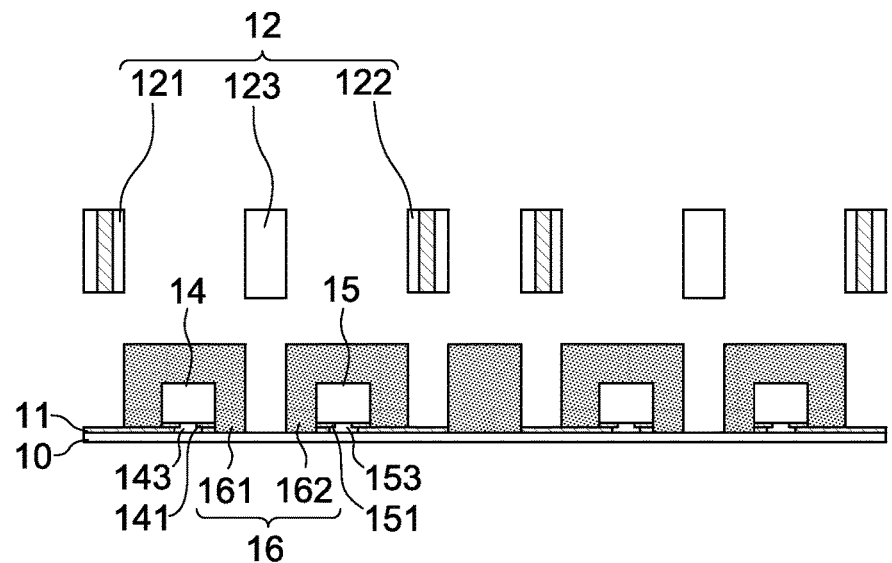

FIG. 9A and FIG. 9B illustrate a manufacturing method in accordance with another embodiment of the present disclosure.

Referring to FIG. 9A, a transparent substrate 10 is provided, which includes a layer of traces layer 11 on a top surface of the substrate 10. A number of light emitters 14 and a number of light detectors 15 are attached to respective ones of the traces 11, and the light emitters 14 and the light detectors 15 are disposed such that the light emitters 14 and the light detectors 15 are positioned in pairs. The light emitters 14 each includes a light emitting area facing the substrate 10. The light detectors each includes a light receiving area facing the substrate 10. An encapsulant 16 is formed to encapsulate the light emitters 14 and the light detectors 15. The encapsulant 16 may be formed by, for example, a selective-mold technique or other technique. The encapsulant 16 includes encapsulant portions 161 encapsulating the light emitters 14 and encapsulant portions 162 encapsulating the light detectors 15. Encapsulant 16 defines a number of receiving spaces between the light emitters 14 and the light detectors 15 and between the pairs of the light emitters 14 and the light detectors 15.

Note that in FIGS. 9A-9B, one grouping of components is identified by number. Another substantially identical grouping of components is also shown, indicating that multiple semiconductor package structures may be manufactured together on one substrate 10, and then separated into single units.

Referring to FIG. 9B, a dielectric layer 12, which includes a portion 121, a portion 122 and a portion 123, is fitted into the receiving spaces of the encapsulant 16. The pattern of portions 121, 122 and 123 match the receiving spaces of the encapsulant 16. Each portion 121 of the dielectric layer 12 includes a conductive structure 131 (e.g., a pillar or post), and the portion 121 laterally surrounds the conductive structure 131. Each portion 122 of the dielectric layer 12 includes a conductive structure 132 (e.g., a pillar or post), and the portion 122 laterally surrounds the conductive structure 132. A singulation or cutting operation is then performed (not shown) to form the semiconductor package structure 2 as shown in FIG. 2.

Figure 10A:
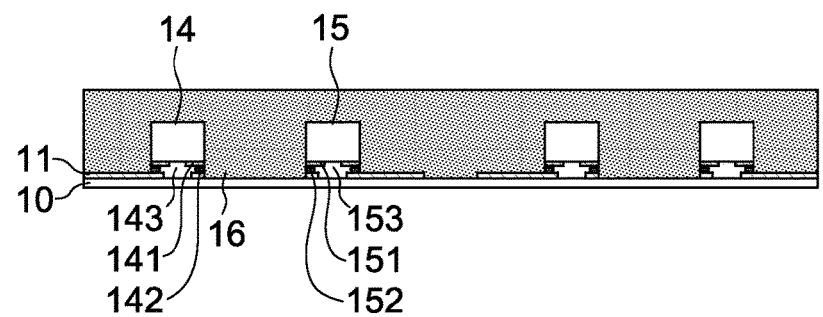
FIG. 10A, FIG. 10B and FIG. 10C illustrate a manufacturing method in accordance with another embodiment of the present disclosure.
Figure 10B:
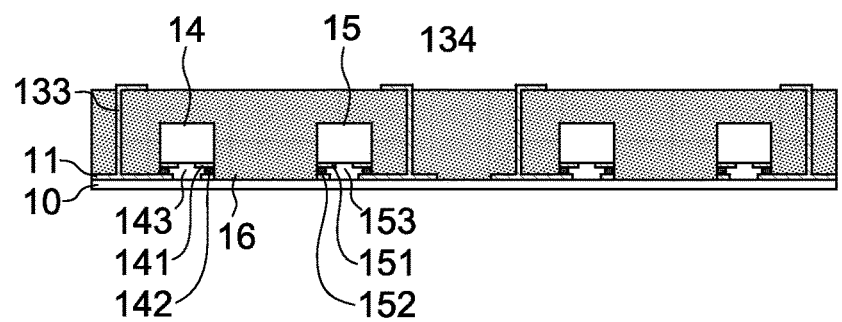
Figure 10C:
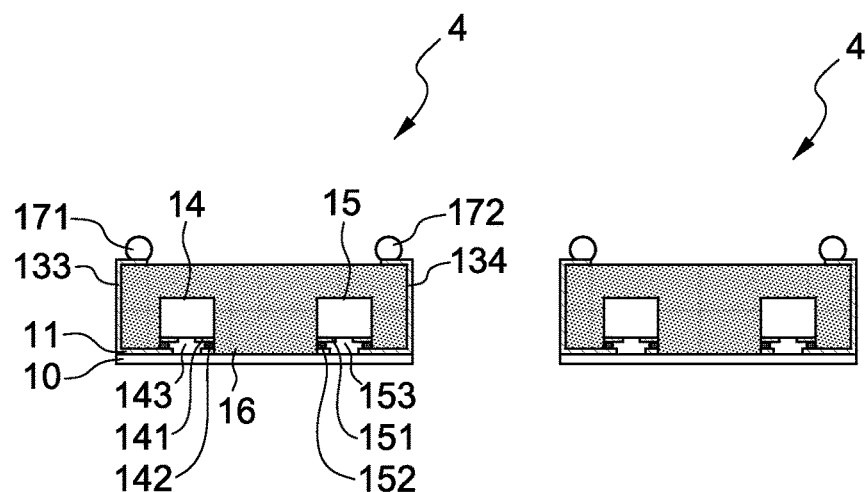

FIGS. 10A-10C illustrate a manufacturing method in accordance with another embodiment of the present disclosure.

Referring to FIG. 10A, a transparent substrate 10 is provided. The substrate 10 includes a layer of traces layer 11 on a top surface of the substrate 10, and a number of light emitters 14 and a number of light detectors 15 attached to respective ones of the traces 11. The light emitters 14 and the light detectors 15 are disposed such that the light emitters 14 and the light detectors 15 are positioned in pairs. The light emitters 14 each includes a light emitting area facing the substrate 10. The light detectors each includes a light receiving area facing the substrate 10. The substrate 10 further includes an encapsulant 16 encapsulating the light emitters 14 and the light detectors 15. The encapsulant 16 is formed by an over-mold or other technique to encapsulate the light emitters 14, the light detectors 15 and the substrate 10.

Note that in FIGS. 10A-10C, one grouping of components is identified by number. Another substantially identical grouping of components is also shown, indicating that multiple semiconductor package structures may be manufactured together on one substrate 10, and then separated into single units (e.g., FIG. 10C).

Referring to FIG. 10B, a portion of the encapsulant 16 is removed (e.g., by a cutting tool) to form a number of trenches extending from top surface of the encapsulant 16 to the top surface of the substrate 10, in which to form conductive traces. A conductive material is filled into the trenches (e.g., by a plating technique) to form conductive traces 133 and 134 within the trenches and extending onto a top surface of the encapsulant 16. Each of the conductive traces 133 and 134 extends within a respective trench from the top surface of the substrate 10 to respective ones of the traces 11.

Referring to FIG. 10C, solder balls 171 and 172 are formed on the encapsulant 16 and are electrically connected to the conductive traces 133 and 134. A singulation or cutting operation is then performed (not shown) to form the semiconductor package structure 4 as shown in FIG. 4.

FIG. 11A-11F illustrate a manufacturing method in accordance with another embodiment of the present disclosure.

Figure 11A:
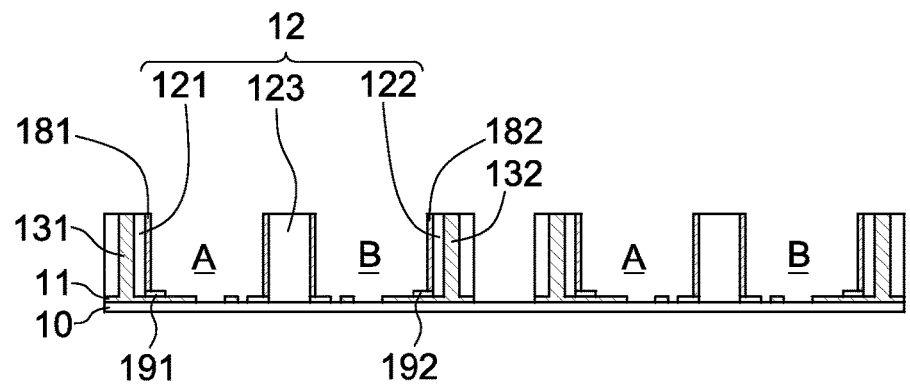
FIG. 11A, FIG. 11B, FIG. 11C, FIG. 11D, FIG. 11E and FIG. 11F illustrate a manufacturing method in accordance with another embodiment of the present disclosure.

Referring to FIG. 11A, a layer of traces 11 is provided on a top surface of a transparent substrate 10. A dielectric layer 12, conductive structures 131 and 132, light blocking layers 181 and 182, and isolators 191 and 192 are formed on the traces 11. The dielectric layer 12 include a portion 121, a portion 122 and a portion 123.

Note that in FIGS. 11A-11F, one grouping of components is identified by number. Another substantially identical grouping of components is also shown, indicating that multiple semiconductor package structures may be manufactured together on one substrate 10, and then separated into single units (e.g., FIG. 11F).

The portion 121 and the portion 123 define a space A. The portion 122 and the portion 123 define a space B. It should be understood that the spaces A and B are three-dimensional spaces, shown in cross-section. Further, as described with respect to the portions 121, 122 and 123 of FIG. 1, the portions 121, 122 and 123 of FIG. 11A are identified in a cross-sectional view; in a top view (not shown), the portion 121 with the portion 123 may fully surround the light emitter 14, and the portion 122 with the portion 123 may fully surround the light detector 15.

The light blocking layer 181 is disposed on a sidewall of the portion 121 and on a sidewall of the portion 123 within the space A. The light blocking layer 182 is disposed on a sidewall of the portion 122 and on a sidewall of the portion 123 within the space B. Each of the light blocking layers 181 and 182 may include Cu, Al, another metal, an alloy, or another suitable material. In one or more embodiments, the light blocking layers 181 and 182 exhibit good light absorption characteristics. In one or more embodiments, one or both of the light blocking layers 181 and 182 have an uneven or relatively rough surface to absorb light.

Figure 11B:
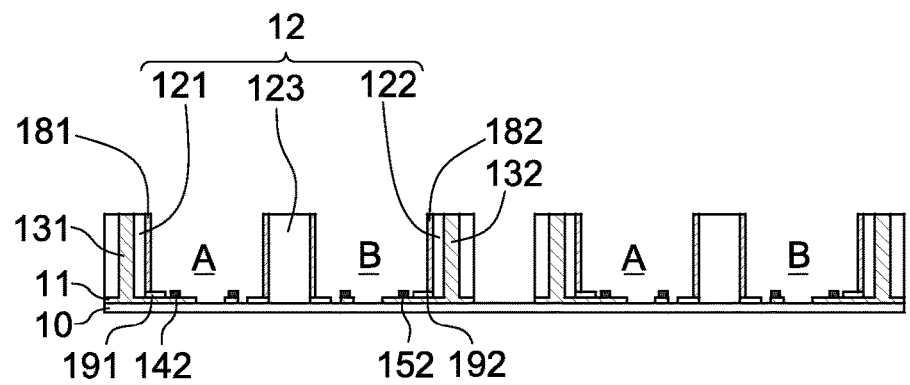

The isolator 191 is disposed on the traces 11 to isolate or separate the light blocking layer 181 from the traces 11. In one or more embodiments, the isolator 191 is disposed across portions of the substrate 10 to provide isolation between the light blocking layer 181 and multiple traces 11 to which the light blocking layer 181 would otherwise come in contact. In one or more embodiments, each of multiple isolators 191 are disposed on a respective trace 11. The isolator 192 is disposed on the traces 11 to isolate or separate the light blocking layer 182 from the traces 11. In one or more embodiments, the isolator 192 is disposed across portions of the substrate 10 to provide isolation between the light blocking layer 182 and multiple traces 11 to which the light blocking layer 182 would otherwise come in contact. In one or more embodiments, each of multiple isolators 192 are disposed on a respective trace 11. The isolators 191 and 192 may each be an insulating layer or a passivation layer. The isolators 191 and 192 may include, for example, polyimide, BCB, dry film, or another suitable material. Referring to FIG. 11B, solder bumps 142 and 152 are formed on ones of the traces 11: solder bumps 142 are formed within the space A, and solder bumps 152 are formed within the space B.

Figure 11C:
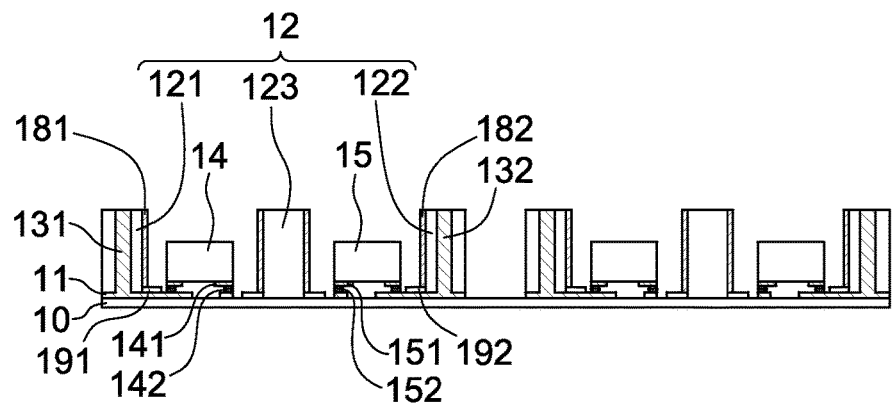

Referring to FIG. 11C, a light emitter 14 is disposed on the solder bumps 142 in space the A and a light detector 15 is disposed on the solder bumps 152 in the space B. The light emitter 14 includes a light emitting area facing the substrate 10. The light detector 15 includes a light receiving area facing the substrate 10. A reflow operation is then performed to bond the light emitter 14 and the light detector 15 to the respective traces 11. In one or more embodiments, each of the solder bumps 142 and 152 have a maximum width or diameter of about 20-50 μm.

Figure 11D:
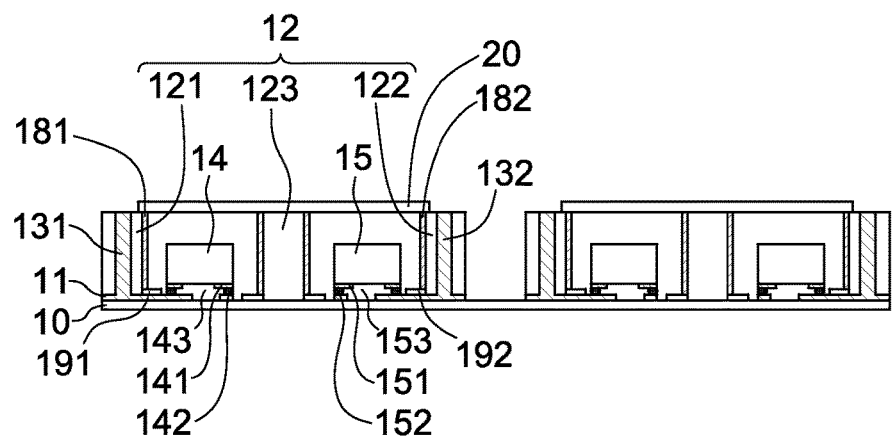

Referring to FIG. 11D, a lid 20 capable of blocking light is attached to the dielectric layer 12. The lid 20 covers the space A and the space B.

Figure 11E:
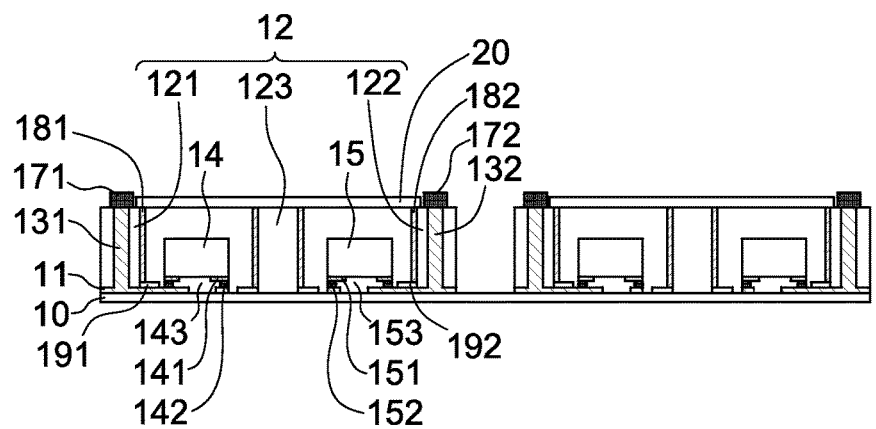

Referring to FIG. 11E, solder paste (which will form solder balls 171 and 172) is disposed on the portion 121 of the dielectric layer 12 and the portion 122 of the dielectric layer 12 by, for example, a printing, plating, or ball dropping technique. The solder paste on the portion 121 and the portion 122 is electrically connected to the conductive structures 131 and 132, respectively.

Figure 11F:
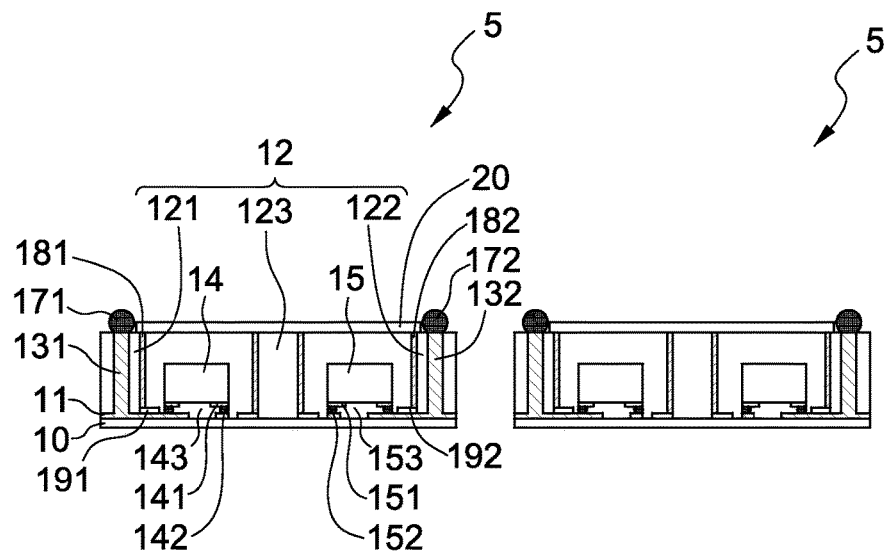

Referring to FIG. 11F, a reflow operation is performed to form solder balls 171 and 172 from the solder paste. A singulation or cutting operation is then performed to form the semiconductor package structure 5 as shown in FIG. 5.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical device comprising:
    a substrate having a top surface;
    a plurality of traces disposed on the top surface of the substrate;
    a light emitter having an emitting area, the light emitter attached to the top surface of the substrate and electrically connected to at least one of the traces, the emitting area facing the substrate, the light emitter configured to emit light within a range of wavelengths and the substrate configured to pass light within the range of wavelengths;
    a light detector having a light receiving area, the light detector attached to the top surface of the substrate and electrically connected to at least one of the traces, the receiving area facing the substrate, wherein the light emitter and the light detector are disposed on a same side of the substrate;
    a conductive structure disposed on the top surface of the substrate and electrically connected to at least one of the traces; and
    an opaque material disposed on the substrate, the opaque material configured to absorb or attenuate the light within the range of wavelengths.

2. The optical device of claim 1, the opaque material encapsulating the light emitter and the light detector.

3. The optical device of claim 1, wherein a space is defined between the light emitter, the substrate and the opaque material, the space configured to allow light emitted from the light emitter within the range of wavelengths to pass to the substrate.

4. The optical device of claim 1, further comprising a dielectric layer, wherein the conductive structure is disposed within the dielectric layer.

5. The optical device of claim 4, further comprising a light blocking layer formed on a sidewall of the dielectric layer.

6. The optical device of claim 5, wherein the light blocking layer comprises a metal layer.

7. The optical device of claim 6, further comprising an isolator formed between the metal layer and the traces, the isolator configured to electrically isolate the metal layer and the traces.

8. The optical device of claim 1, further comprising a lid disposed over the light emitter and the light detector.

9. The optical device of claim 1, wherein the light emitter and the light detector are disposed side by side on the substrate.

10. An optical device comprising:
a substrate;
a light emitter including an emitting area facing a surface of the substrate, the light emitter configured to emit light within a range of wavelengths;
a light receiver including a receiving area facing the surface of the substrate, the light receiver configured to receive the light reflected from an object and passed through the substrate, wherein the light emitter and the light receiver are disposed on a same side of the substrate;
a conductive structure disposed on and electrically connected to the substrate; and
an opaque material disposed on the substrate between the light emitter and the light receiver.

11. The optical device of claim 10, wherein the opaque material is an encapsulant encapsulating the light emitter and the light receiver.

12. The optical device of claim 10, wherein a space is defined between the substrate, the opaque material, and the light emitter, the space configured to allow light within the range of wavelengths to pass.

13. The optical device of claim 10, wherein a space is defined between the substrate, the opaque material, and the light receiver, the space configured to allow light within the range of wavelengths to pass.

14. The optical device of claim 10, further comprising a dielectric layer disposed on the substrate.

15. The optical device of claim 14, the dielectric layer comprising a divider disposed between the light emitter and the light receiver.

16. The optical device of claim 15, the divider comprising a light blocking layer formed on a sidewall of the divider.

17. A method of making an optical device, comprising:
providing a substrate, the substrate comprising a conductive structure disposed on and electrically connected to the substrate;
disposing a light emitter on a surface of the substrate, the light emitter including an emitting area, the light emitter disposed such that the emitting area faces the surface of the substrate;
disposing a light receiver on the surface of the substrate, the light receiver including a receiving area, the light receiver disposed such that the receiving area faces the surface of the substrate, wherein the light emitter and the light receiver are disposed on a same side of the substrate; and
disposing an opaque material on the substrate between the light emitter and the light receiver.

18. The method of claim 17, wherein disposing the opaque material comprises disposing an encapsulant to encapsulate the light emitter and the light receiver.

19. The method of claim 17, further comprising disposing a lid over the light emitter and the light receiver.

20. The method of claim 17, wherein the substrate further comprises a dielectric layer, and the conductive structure is disposed within the dielectric layer.

21. The method of claim 20, further comprising disposing a light blocking layer on a sidewall of the dielectric layer, and forming an electrical isolator between the light blocking layer and the substrate.

* * * * *